(12) United States Patent
Kono

(10) Patent No.: US 11,784,244 B2
(45) Date of Patent: Oct. 10, 2023

(54) METHOD FOR MANUFACTURING SEMICONDUCTOR DEVICE HAVING JFET

(71) Applicant: DENSO CORPORATION, Kariya (JP)

(72) Inventor: Kenji Kono, Kariya (JP)

(73) Assignee: DENSO CORPORATION, Kariya (JP)

( * ) Notice: Subject to any disclaimer, the term of this patent is extended or adjusted under 35 U.S.C. 154(b) by 246 days.

(21) Appl. No.: 17/358,910

(22) Filed: Jun. 25, 2021

(65) Prior Publication Data
US 2021/0328048 A1 Oct. 21, 2021

Related U.S. Application Data

(63) Continuation of application No. PCT/JP2020/001328, filed on Jan. 16, 2020.

(30) Foreign Application Priority Data

Jan. 21, 2019 (JP) .................. 2019-007846

(51) Int. Cl.
*H01L 29/66* (2006.01)
*H01L 21/04* (2006.01)
*H01L 21/265* (2006.01)

(52) U.S. Cl.
CPC ...... *H01L 29/66909* (2013.01); *H01L 21/046* (2013.01); *H01L 21/2652* (2013.01); *H01L 29/66068* (2013.01)

(58) Field of Classification Search
None
See application file for complete search history.

(56) References Cited

U.S. PATENT DOCUMENTS

| 6,303,947 | B1 | 10/2001 | Ueno |
| 6,455,892 | B1 * | 9/2002 | Okuno ............... H01L 29/7828 |
| | | | 257/77 |
| 6,870,189 | B1 | 3/2005 | Harada et al. |
| 7,279,368 | B2 | 10/2007 | Harris et al. |

(Continued)

FOREIGN PATENT DOCUMENTS

| JP | 2008-282878 A | 11/2008 |
| JP | 2013222933 A | 10/2013 |
| JP | 2014220434 A | 11/2014 |

*Primary Examiner* — Evren Seven
(74) *Attorney, Agent, or Firm* — POSZ LAW GROUP, PLC

(57) ABSTRACT

A method for manufacturing a semiconductor device having a junction field effect transistor, includes: preparing a substrate having a first conductivity type drift layer; forming a first conductivity type channel layer above the drift layer by an epitaxial growth, to thereby produce a semiconductor substrate; forming a second conductivity type gate layer within the channel layer by performing an ion-implantation; forming a second conductivity type body layer at a position separated from the gate layer within the channel layer by performing an ion-implantation; and forming a second conductivity type shield layer at a position that is to be located between the gate layer and the drift layer within the channel layer by performing an ion-implantation. The shield layer is formed to face the gate layer while being separated from the gate layer, and is kept to a potential different from that of the gate layer.

5 Claims, 17 Drawing Sheets

(56) References Cited

U.S. PATENT DOCUMENTS

| | | | |
|---|---|---|---|
| 7,691,694 B2 * | 4/2010 | Kumar | H01L 29/8083 |
| | | | 257/77 |
| 10,263,105 B2 * | 4/2019 | Iwamuro | H01L 29/1095 |
| 2002/0167011 A1 | 11/2002 | Kumar et al. | |
| 2005/0127396 A1 | 6/2005 | Mitra et al. | |
| 2007/0241338 A1 | 10/2007 | Yamamoto et al. | |
| 2007/0252178 A1 | 11/2007 | Onose | |
| 2008/0308838 A1 * | 12/2008 | McNutt | H01L 29/8083 |
| | | | 257/E29.198 |
| 2009/0278137 A1 | 11/2009 | Sheridan et al. | |
| 2012/0049902 A1 * | 3/2012 | Corona | H01L 29/7322 |
| | | | 257/77 |
| 2014/0231883 A1 * | 8/2014 | Esteve | H01L 29/8083 |
| | | | 438/192 |
| 2014/0346528 A1 | 11/2014 | Hisada et al. | |
| 2015/0263178 A1 * | 9/2015 | Konrath | H01L 29/66909 |
| | | | 438/193 |
| 2016/0035904 A1 | 2/2016 | Hisada et al. | |
| 2020/0098935 A1 | 3/2020 | Kono | |

\* cited by examiner

METHOD FOR MANUFACTURING SEMICONDUCTOR DEVICE HAVING JFET

CROSS REFERENCE TO RELATED APPLICATIONS

The present application is a continuation application of International Patent Application No. PCT/JP2020/001328 filed on Jan. 16, 2020, which designated the U.S. and claims the benefit of priority from Japanese Patent Application No. 2019-007846 filed on Jan. 21, 2019. The entire disclosures of all of the above applications are incorporated herein by reference.

TECHNICAL FIELD

The present disclosure relates to a method for manufacturing a semiconductor device in which a junction field effect transistor (hereinafter, also referred to as a JFET) is formed.

BACKGROUND

For example, a semiconductor device formed with a JFET is known. Such a semiconductor device has a semiconductor substrate in which an N+ type drain layer, an N− type drift layer, and an N type channel layer are sequentially stacked. In the surface portion of the channel layer, an N+ type source layer is formed. Further, in the channel layer, a P+ type gate layer is formed so as to penetrate the source layer, and a P+ type body is formed at a position separated from the gate layer.

In such a semiconductor device, since the body layer is formed, if a surge current is generated, the surge current can be discharged from the body layer. Therefore, it is possible to restrict the surge current from concentrating on the gate layer.

SUMMARY

The present disclosure describes a method for manufacturing a semiconductor device formed with a JFET.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
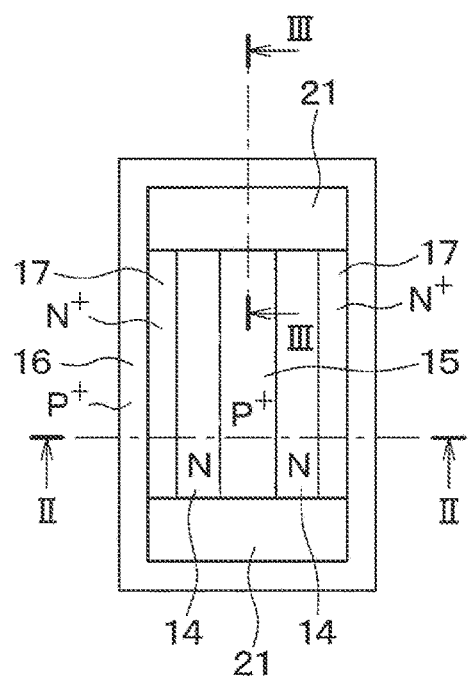
FIG. 1 is a plan view of one cell of a semiconductor device according to a first embodiment.

In a semiconductor device formed with a JFET, for example, it is desired to reduce the switching loss by reducing a mirror capacitance ratio. Therefore, the present inventors have conducted diligent studies and found that the mirror capacitance ratio can be reduced by arranging, between the gate layer and the drift layer, a shield layer maintained at a potential different from that of the gate layer. The present inventors further have examined a method for easily manufacturing a semiconductor device having such a shield layer.

According to an aspect of the present disclosure, a method for manufacturing a semiconductor device formed with a junction field effect transistor, includes: preparing a substrate having a first conductivity type drift layer; forming a first conductivity type channel layer having an impurity concentration higher than that of the first conductivity type drift layer above the first conductivity type drift layer by an epitaxial growth, to thereby produce a semiconductor substrate; forming a second conductivity type gate layer within the first conductivity type channel layer by performing an ion-implantation, the second conductivity type gate layer extending from a surface of the semiconductor substrate adjacent to the first conductivity type channel layer in a depth direction corresponding to a thickness direction of the semiconductor substrate; forming a second conductivity type body layer at a position separated from the second conductivity type gate layer within the first conductivity type channel layer by performing an ion-implantation, the second conductivity type body layer extending from the surface of the semiconductor substrate in the depth direction; and forming a second conductivity type shield layer at a position that is to be located between the second conductivity type gate layer and the first conductivity type drift layer within the first conductivity type channel layer by performing an ion-implantation, the second conductivity type shield layer being formed to face the second conductivity type gate layer while being separated from the second conductivity type gate layer, the second conductivity type shield layer being kept to a potential different from that of the second conductivity type gate layer.

According to the method, each layer can be formed by performing an ion implantation appropriately, and thus the semiconductor device having the shield layer can be manufactured by a simple method. That is, it is possible to manufacture a semiconductor device having the JFET, which is capable of reducing the mirror capacitance ratio, by a simple method.

Embodiments of the present disclosure will be hereinafter described with reference to the drawings. In the following description, the same or equivalent parts are denoted by the same reference numerals throughout the embodiments.

First Embodiment

A first embodiment will be described with reference to FIGS. 1 to 3. First, a configuration of a semiconductor device formed with a JFET of the present embodiment will be described. Note that FIG. 1 is a plan view showing one cell of the JFET of the present embodiment, and the semiconductor device is provided by arranging a plurality of cells shown in FIG. 1 so as to be adjacent to each other. Further, in FIG. 1, illustrations of an interlayer insulating film 24, a gate electrode 25, an upper electrode 26, and the like, which will be described later, are omitted.

The semiconductor device includes a semiconductor substrate 10 having a drain layer 11 made of an $N^{++}$ type silicon carbide (hereinafter, also referred to as SiC) substrate. An $N^+$ type buffer layer 12 having an impurity concentration lower than that of the drain layer 11 is disposed on the drain layer 11, and an $N^-$ type drift layer 13 having an impurity concentration lower than that of the buffer layer 12 is disposed on the buffer layer 12. The buffer layer 12 and the drift layer 13 are each formed, for example, by growing an epitaxial film made of SiC on the SiC substrate forming the drain layer 11.

An N type channel layer 14 having an impurity concentration higher than that of the drift layer 13 is disposed on the drift layer 13. The channel layer 14 is formed by growing an epitaxial film of SiC, as will be described later. In the present embodiment, the semiconductor substrate 10 has a surface 10a, which will be referred to as one surface or a first surface, and a surface of the channel layer 14 is included in the surface 10a.

In the channel layer 14, a $P^+$ type gate layer 15 and a $P^+$ type body layer 16 are formed. Each of the gate layer 15 and the body layer 16 has an impurity concentration higher than that of the channel layer 14. In the present embodiment, the body layer 16 has a quadrangular frame shape having a lengthwise side in one direction as a longitudinal direction, in a plan view of one cell region. The body layer 16 has a rectangular frame shape having a lengthwise side in a vertical direction of FIG. 1. The gate layer 15 is located inside the body layer 16, but is separated from the body layer 16. The gate layer 15 has a rectangular shape having a lengthwise side in the longitudinal direction of the body layer 16, in a plan view of one cell region.

Figure 2:
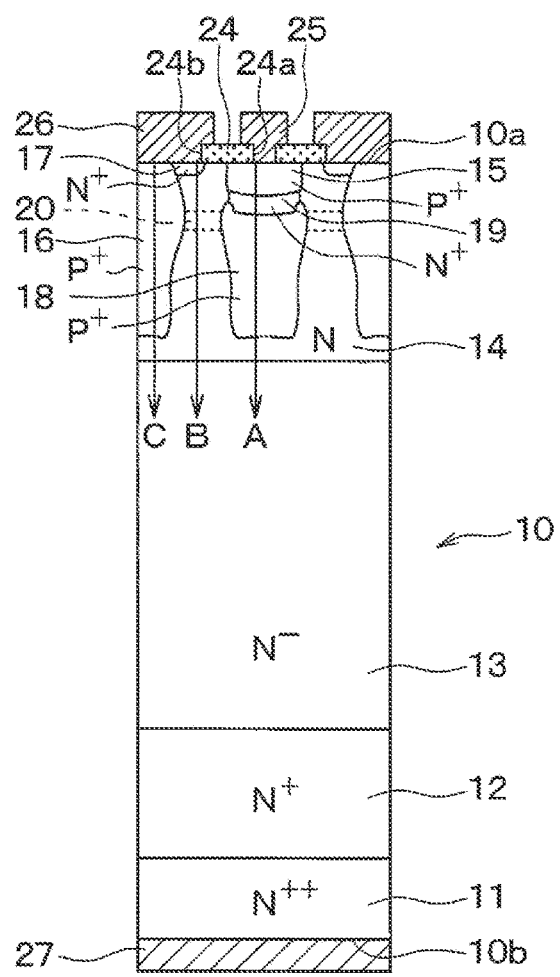
FIG. 2 is a cross-sectional view taken along a line II-II shown in FIG. 1.

The semiconductor substrate 10 has a thickness direction corresponding to a vertical direction in FIG. 2. The thickness direction is also referred to as a depth direction. The gate layer 15 and the body layer 16 extend in the depth direction from the one surface 10a of the semiconductor substrate 10 (that is, the surface of the channel layer 14). The body layer 16 reaches a position deeper than the gate layer 15. As will be described later, the body layer 16 of the present embodiment is formed by ion-implanting impurities to the one surface 10a of the semiconductor substrate 10. Therefore, the body layer 16 has a shape in which an intermediate portion in the depth direction is expanded. The depth direction of the semiconductor substrate 10 can be said to be a stacking direction of the drain layer 11, the drift layer 13, and the channel layer 14.

Figure 4:
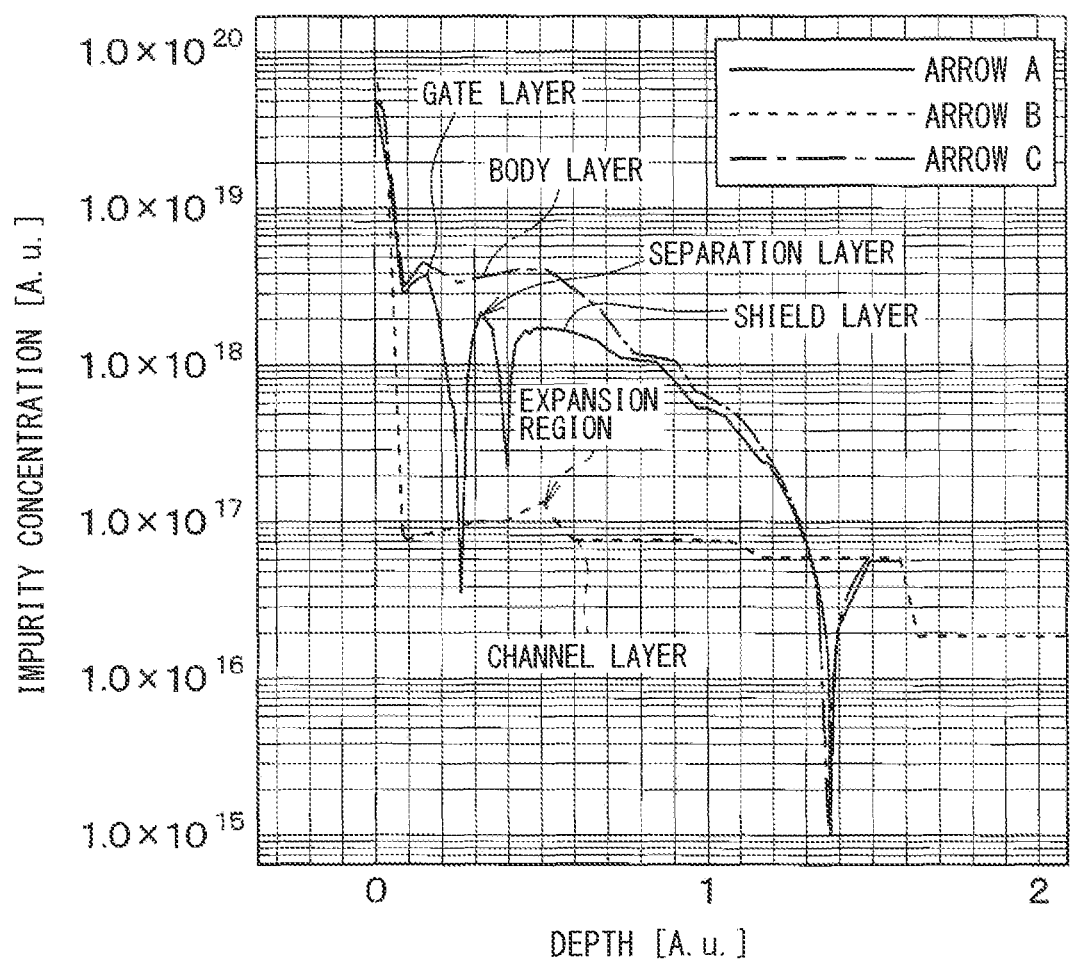
FIG. 4 is a diagram showing simulation results of impurity concentration profiles along arrows A, B, and C in FIG. 2.

An $N^+$ type source layer 17 is formed in the surface portion of the channel layer 14 so as to be in contact with the body layer 16. The source layer 17 has an impurity concentration higher than that of the channel layer 14. Although not particularly limited, in the present embodiment, the gate layer 15 and the body layer 16 each have an impurity concentration about 10 times higher than that of the channel layer 14, as also shown in FIG. 4, Further, in the channel layer 14, a shield layer 18 is formed at a position deeper than the gate layer 15. The shield layer 18 faces the gate layer 15 while being separated from the gate layer 15. That is, in the channel layer 14, the shield layer 18 facing the gate layer 15 is formed at a position between the gate layer 15 and the drift layer 13.

In the present embodiment, the shield layer 18 is a $P^+$ type having an impurity concentration equivalent to that of the body layer 16. The shield layer 18 has a rectangular shape having a lengthwise side along the longitudinal direction of the gate layer 15, in a plan view. The length of the shield layer 18 in the longitudinal direction is longer than the length of the gate layer 15 in the longitudinal direction, so that both ends of the shield layer 18 in the longitudinal direction are connected to the body layer 16. Thus, the shield layer 18 is electrically connected to the body layer 16. That is, the shield layer 18 of the present embodiment has the same potential as the body layer 16. In the present embodiment, the shield layer 18 is thus maintained at a potential different from that of the gate layer 15.

As will be described later, the shield layer 18 of the present embodiment is formed by ion-implanting impurities to the one surface 10a of the semiconductor substrate 10. Therefore, the shield layer 18 has a shape in which the portion adjacent to the gate layer 15 is expanded more than the portion opposite to the gate layer 15.

In the channel layer 14, an $N^+$ type separation layer 19 is further formed at a position between the gate layer 15 and the shield layer 18. The separation layer 19 electrically separates the gate layer 15 and the shield layer 18 from each other. As shown in FIG. 4, the separation layer 19 has an impurity concentration higher than that of the channel layer 14. In a region along the arrow A in FIG. 2, the impurity concentration becomes low at the boundary between the gate layer 15 and the separation layer 19 and at the boundary between the separation layer 19 and the shield layer 18, and peaks in the separation layer 19.

Further, in the channel layer 14, an N type expansion region 20 is formed between the portion of the shield layer 18 adjacent to the gate layer 15 and a portion of the body layer 16 located at the same depth as the portion of the shield layer 18. The expansion region 20 restricts the distance between the body layer 16 and the shield layer 18 from becoming too narrow. As shown in FIG. 4, although the impurity concentration of the expansion region 20 is lower than that of the separation layer 19, the impurity concentration of the expansion region 20 is higher than that of the channel layer 14. Therefore, in a region along the arrow B in FIG. 2, the impurity concentration has a shape having a peak at the depth of the expansion region 20. In a region along the arrow C in FIG. 2, the impurity concentration gradually decreases as the depth increases, since the region is along the body layer 16.

Figure 3:
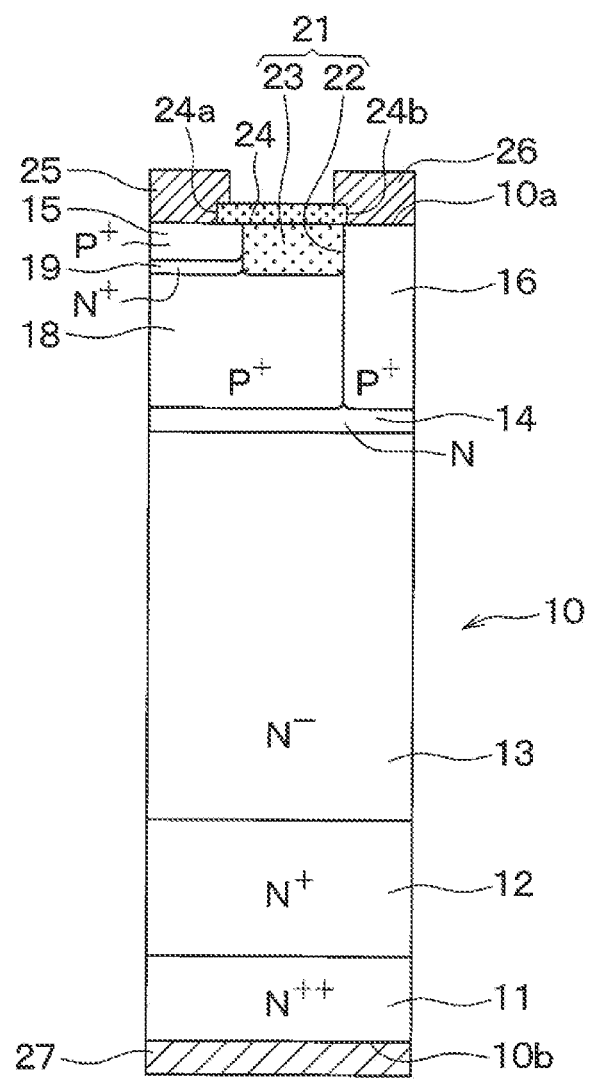
FIG. 3 is a cross-sectional view taken along line III-Ill shown in FIG. 1.

Further, in the present embodiment, as shown in FIGS. 1 and 3, the surface portion of the channel layer 14 is formed with a shallow trench isolation (STI) separating portion 21 that electrically separates the gate layer 15 and the body layer 16 from each other. Specifically, the STI separating portion 21 is formed between the gate layer 15 and the body layer 16, at each of opposite ends of the gate layer 15 in the longitudinal direction. In the present embodiment, the STI separation portion 21 is provided by an insulating film 23 embedded in a trench 22 having a predetermined depth.

An interlayer insulation film 24 is formed on the one surface 10a of the semiconductor substrate 10. The interlayer insulating film 24 is formed with a first contact hole 24a for exposing the gate layer 15 and a second contact hole 24b for exposing the body layer 16 and the source layer 17. A gate electrode 25 is disposed on the interlayer insulating film 24 so as to be electrically connected to the gate layer 15 through the first contact hole 24a. Further, an upper electrode 26 is formed on the interlayer insulating film 24 so as to be electrically connected to the body layer 16 and the source layer 17 through the second contact hole 24b.

A lower electrode 27 is formed on the other surface (second surface) 10b of the semiconductor substrate 10 opposite to the one surface 10a. The lower electrode 27 is electrically connected to the drain layer 11.

The semiconductor device according to the present embodiment has the configuration as described hereinabove. In the present embodiment, $N^-$ type, N type, $N^+$ type and $N^{++}$ type correspond to a first conductivity type, and $P^+$ type corresponds to a second conductivity type. In the present embodiment, as described above, the semiconductor substrate 10 is configured to include the drain layer 11, the buffer layer 12, the drift layer 13, the channel layer 14, the gate layer 15, the body layer 16, the source layer 17 and the shield layer 18. The drain layer 11 is formed of the SiC substrate, and the buffer layer 12, the drift layer 13, the channel layer 14 and the like are each formed by growing an epitaxial film made of SiC. Therefore, the semiconductor device of the present embodiment may be defined as a SiC semiconductor device.

The semiconductor device as described above may be of a normally-on type in which a current flows between the upper electrode 26 and the lower electrode 27 in a state where the gate layer 15 is not applied with a predetermined gate voltage. Alternatively, the semiconductor device may be of a normally-off type in which no current flows between the upper electrode 26 and the lower electrode 27 in the state where the gate layer 15 is not applied with the predetermined gate voltage.

Since the semiconductor device is formed with the body layer 16, if a surge current is generated, the surge current flows to the body layer 16. Therefore, it is possible to restrict the surge current from concentrating on the gate layer 15. Further, the shield layer 18 connected to the body layer 16 is formed below the gate layer 15. Therefore, the mirror capacitance ratio can be reduced, and the switching loss can be reduced.

Next, a method for manufacturing the semiconductor device will be described with reference to FIGS. 5A to 5G and FIGS. 6A to 6G. FIGS. 5A to 5G are cross-sectional views corresponding to FIG. 2, and FIGS. 6A to 6G are cross-sectional views corresponding to FIG. 3. Each of FIGS. 5A to 5G and each of FIGS. 6A to 6G are cross-sectional views at different positions, but in the same step.

Figure 5A:
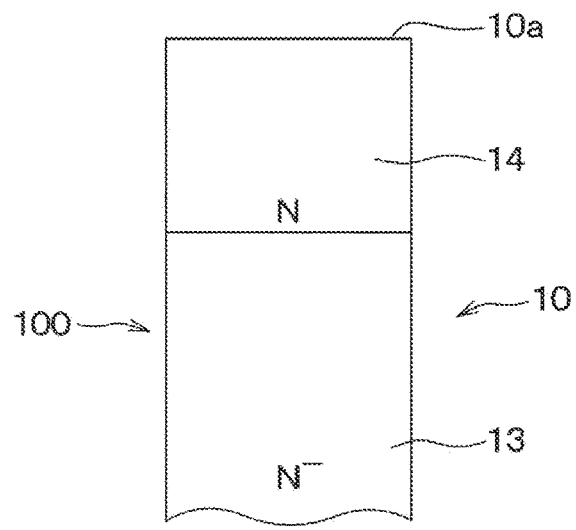
FIG. 5A is a cross-sectional view for illustrating a step of a manufacturing process of the semiconductor device shown in FIG. 2.
Figure 6A:
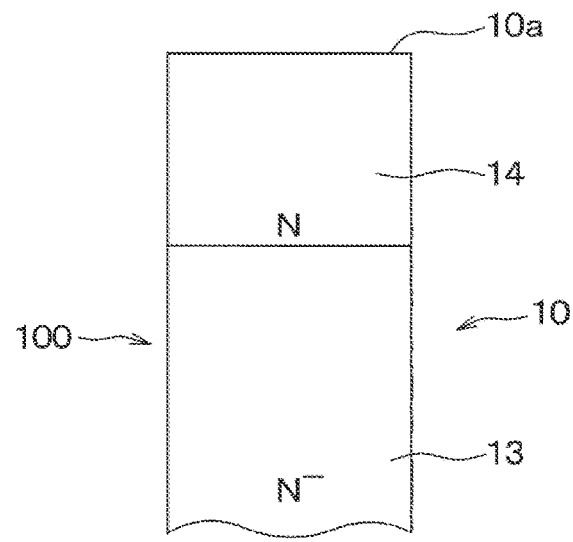
FIG. 6A is a cross-sectional view showing a step of the manufacturing process of the semiconductor device shown in FIG. 3.

Firstly, as shown in FIG. 5A and FIG. 6A, a substrate 100 having a drift layer 13 is prepared. In the present embodiment, since the buffer layer 12 and the drift layer 13 are each formed by growing an epitaxial film of SiC on the SiC substrate forming the drain layer 11, the substrate 100 also has the drain layer 11 and the buffer layer 12. The semiconductor substrate 10 is formed by forming the channel layer 14 on the drift layer 13, for example, by growing an epitaxial film of SiC.

In FIG. 5A and FIG. 6A, the drain layer 11 and the buffer layer 12 located below the drift layer 13 are not shown. Also in FIGS. 5B to 5G and FIGS. 6B to 6G described later, the drain layer 11 and the buffer layer 12 located below the drift layer 13 are not shown.

Figure 5B:
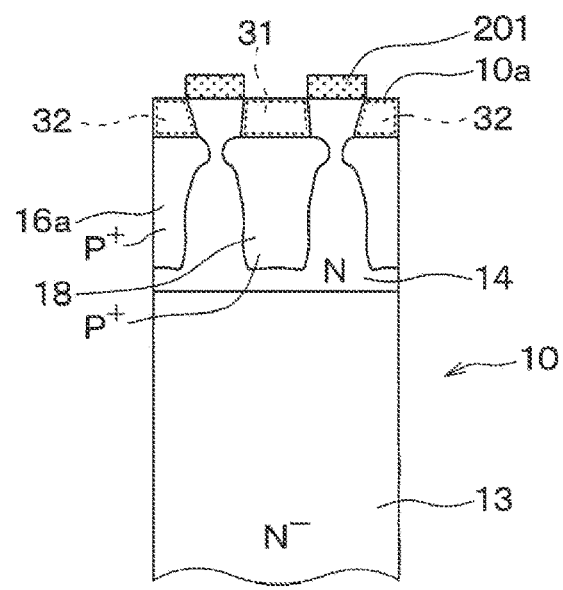
FIG. 5B is a cross-sectional view illustrating a step of the manufacturing process of the semiconductor device subsequent to FIG. 5A.
Figure 6B:
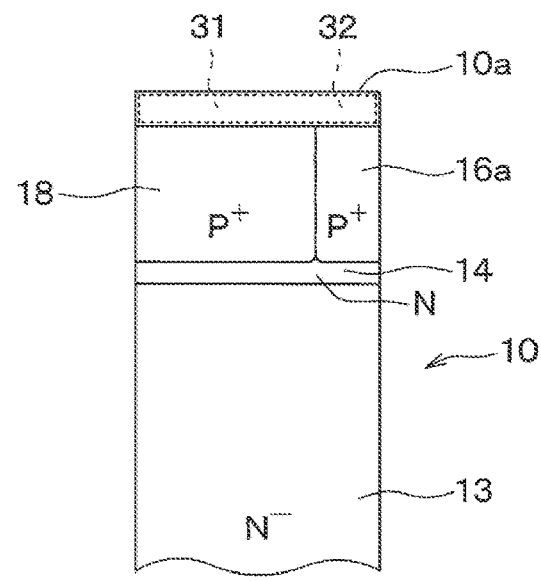
FIG. 6B is a cross-sectional view illustrating a step of the manufacturing process of the semiconductor device subsequent to FIG. 6A.

Next, as shown in FIG. 5B and FIG. 6B, a mask 201 is formed on the channel layer 14 to have openings in formation regions where the body layer 16 and the shield layer 18 are to be formed. As the mask 201, for example, an oxide film or a resist is used. The same applies to the masks 202 to 205 described later.

Then, by ion-implanting a P type impurity such as aluminum, a lower body layer 16a, which is a lower part of the body layer 16, and the shield layer 18 are formed. Thereafter, the mask 201 is removed. The lower body layer 16a is a portion of the body layer 16 formed at the same depth as the shield layer 18. Further, in this step, the shield layer 18 is formed so as to be connected to the lower body layer 16a at both ends in the longitudinal direction. That is, the lower body layer 16a and the shield layer 18 are integrally formed.

In the present embodiment, since the lower body layer 16a and the shield layer 18 are formed by performing the ion implantation after the semiconductor substrate 10 is formed, impurities are implanted to a deep position through the one surface 10a of the semiconductor substrate 10. Therefore, a residual region 31 in which the P type impurities remain is formed above the shield layer 18. Similarly, a residual region 32 in which the P type impurities remain is formed above the lower body layer 16a.

Further, in this step, since the impurities are implanted to a deep position through the one surface 10a of the semiconductor substrate 10, the acceleration voltage at the time of the ion implantation is likely to increase. Therefore, the impurities implanted into the semiconductor substrate 10 readily spread in a planar direction of the semiconductor substrate 10. Therefore, the lower body layer 16a and the shield layer 18 each have a shape in which the portion adjacent to the one surface 10a of the semiconductor substrate is expanded more than the portion adjacent to the other surface 10b of the semiconductor substrate 10. Hereinafter, the portion of the lower body layer 16a adjacent to the one surface 10a of the semiconductor substrate 10 is also referred to as an upper portion of the lower body layer 16a. Similarly, the portion of the shield layer 18 adjacent to the one surface 10a of the semiconductor substrate 10 is also referred to as an upper portion of the shield layer 18.

Figure 5C:
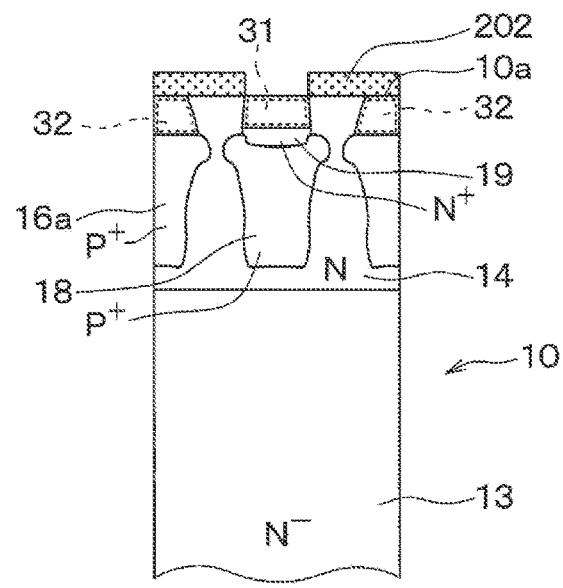
FIG. 5C is a cross-sectional view illustrating a step of the manufacturing process of the semiconductor device subsequent to FIG. 5B.
Figure 6C:
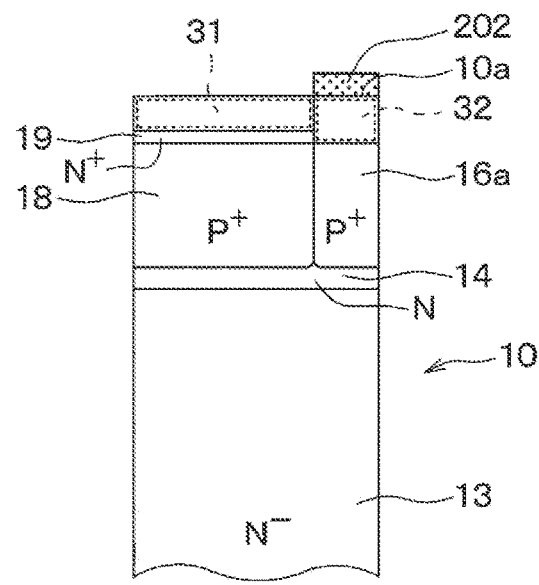
FIG. 6C is a cross-sectional view illustrating a step of the manufacturing process of the semiconductor device subsequent to FIG. 6B.

Next, as shown in FIG. 5C and FIG. 6C, a mask 202 is formed on the channel layer 14 to have an opening in a formation region where the separation layer 19 is to be formed. Then, the separation layer 19 is formed above the shield layer 18 by ion-implanting an N type impurity such as nitrogen.

Figure 5D:
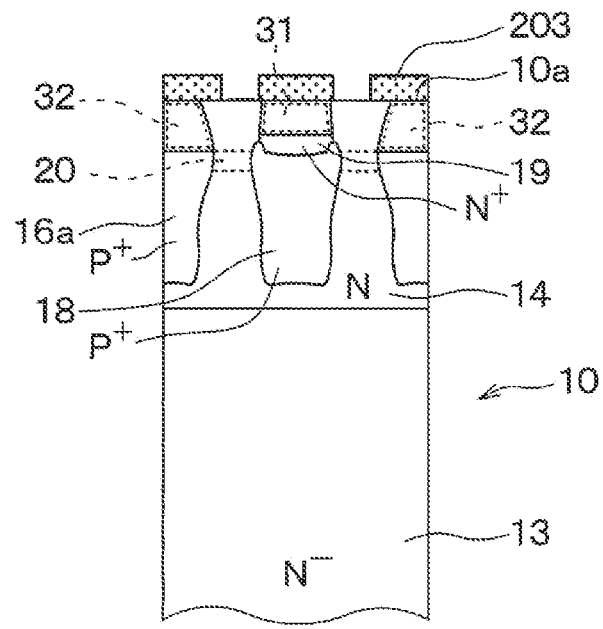
FIG. 5D is a cross-sectional view illustrating a step of the manufacturing process of the semiconductor device subsequent to FIG. 5C.
Figure 6D:
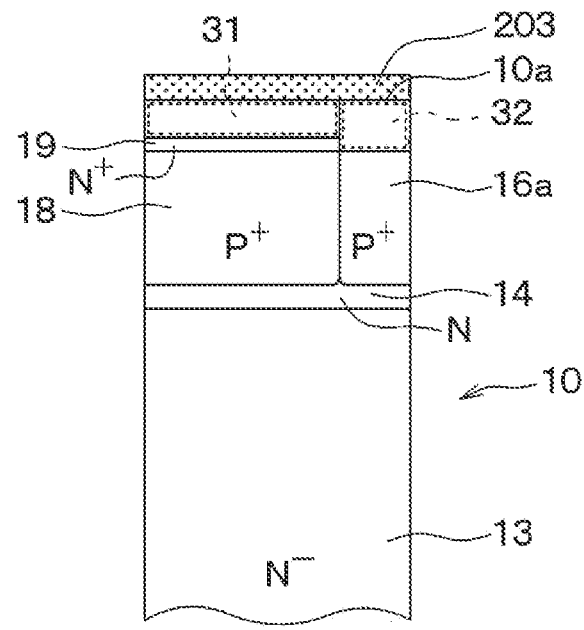
FIG. 6D is a cross-sectional view illustrating a step of the manufacturing process of the semiconductor device subsequent to FIG. 6C.

Subsequently, as shown in FIG. 5D and FIG. 6D, a mask 203 is formed on the channel layer 14 to have an opening in a formation region where the expansion region 20 is to be formed. Then, by ion-implanting an N type impurity such as nitrogen, the expansion region 20 is formed in an area located between the upper part of the lower body layer 16a and the upper part of the shield layer 18. Since the impurity concentration of the expansion region 20 is sufficiently smaller than that of the body layer 16, the expansion region 20 may be formed by ion implantation without arranging the mask 203.

That is, by performing the step shown in FIG. 5B and FIG. 6B as described above, the lower body layer 16a and the shield layer 18 each have a configuration in which the upper portion is expanded more than the lower portion. In this case, if the distance between the upper portion of the lower body layer 16a and the upper portion of the shield layer 18 is too narrow, there is a possibility of pinch-off. Therefore, by forming the expansion region 20, the distance between the lower body layer 16a and the upper portion of the shield layer 18 is set to a distance that does not cause the pinch off.

Either the step shown in FIGS. 5C and 6C or the step shown in FIGS. 5D and 6D may be performed prior to the other. That is, the separation layer 19 may be formed after the expansion region 20 is formed.

Figure 5E:
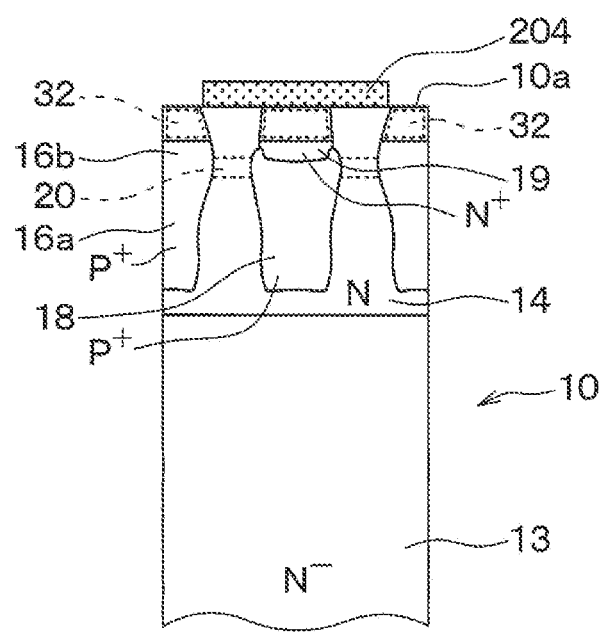
FIG. 5E is a cross-sectional view illustrating a step of the manufacturing process of the semiconductor device subsequent to FIG. 5D.
Figure 6E:
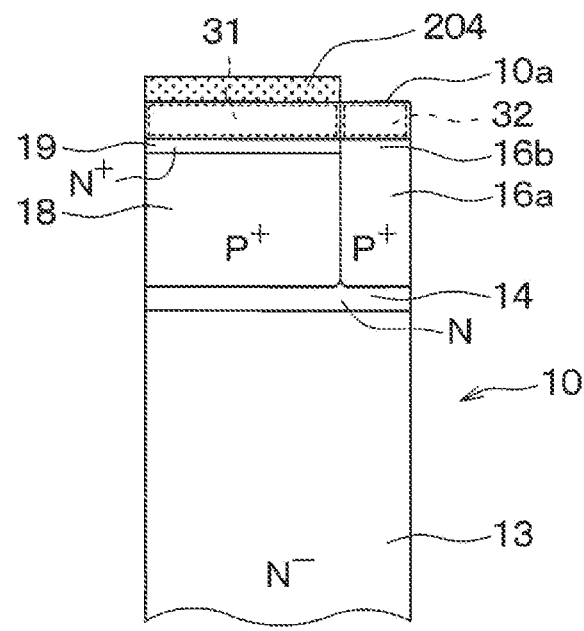
FIG. 6E is a cross-sectional view illustrating a step of the manufacturing process of the semiconductor device subsequent to FIG. 6D.

Subsequently, as shown in FIG. 5E and FIG. 6E, a mask 204 is formed on the channel layer 14 to have an opening in a formation region where the body layer 16 is to be formed. Then, by ion-implanting a P type impurity such as aluminum, an intermediate body layer 16b forming an intermediate part of the body layer 16 is formed. Then, the mask 204 is removed. The intermediate body layer 16b is a part of the body layer 16 formed at the same depth as the separation layer 19.

Figure 5F:
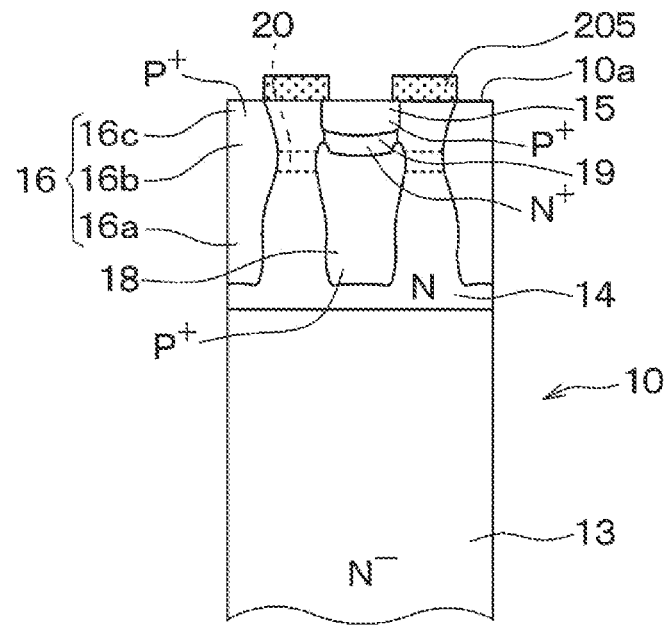
FIG. 5F is a cross-sectional view illustrating a step of the manufacturing process of the semiconductor device subsequent to FIG. 5E.
Figure 6F:
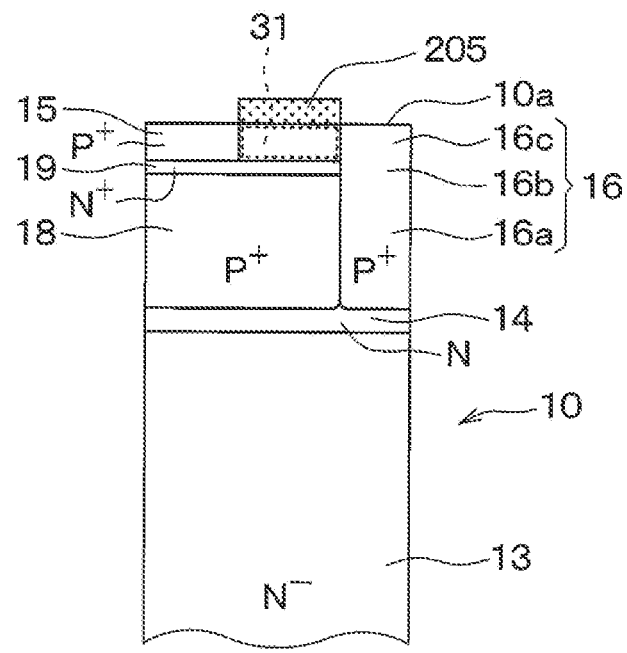
FIG. 6F is a cross-sectional view illustrating a step of the manufacturing process of the semiconductor device subsequent to FIG. 6E.

Next, as shown in FIG. 5F and FIG. 6F, a mask 205 is formed on the channel layer 14 to have an opening in a formation region where the gate layer 15 and the body layer 16 are to be formed. Then, by ion-implanting a P type impurity such as aluminum, an upper body layer 16c forming an upper part of the body layer 16 is formed to constitute the body layer 16, and the gate layer 15 is formed. The upper body layer 16c is a part of the body layer 16 formed at the same depth as the gate layer 15. Further, after this step is completed, as shown in FIG. 6F, the gate layer 15 and the body layer 16 are connected by the residual region 31.

Figure 5G:
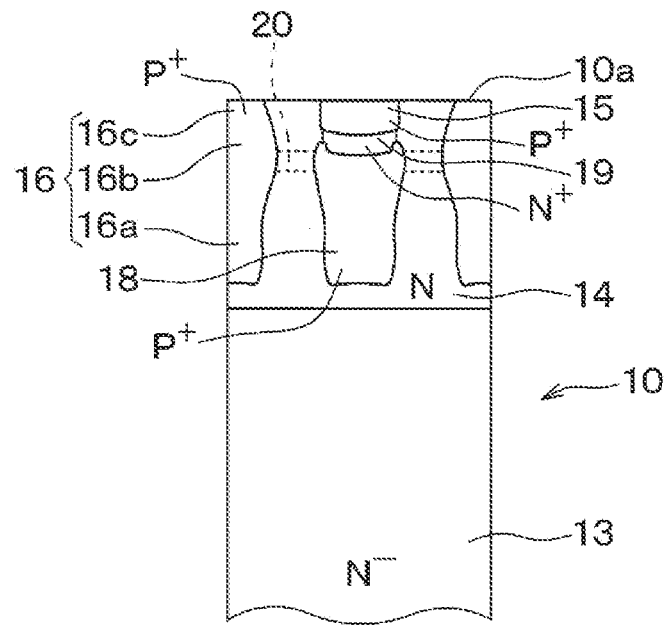
FIG. 5G is a cross-sectional view illustrating a step of the manufacturing process of the semiconductor device subsequent to FIG. 5F.
Figure 6G:
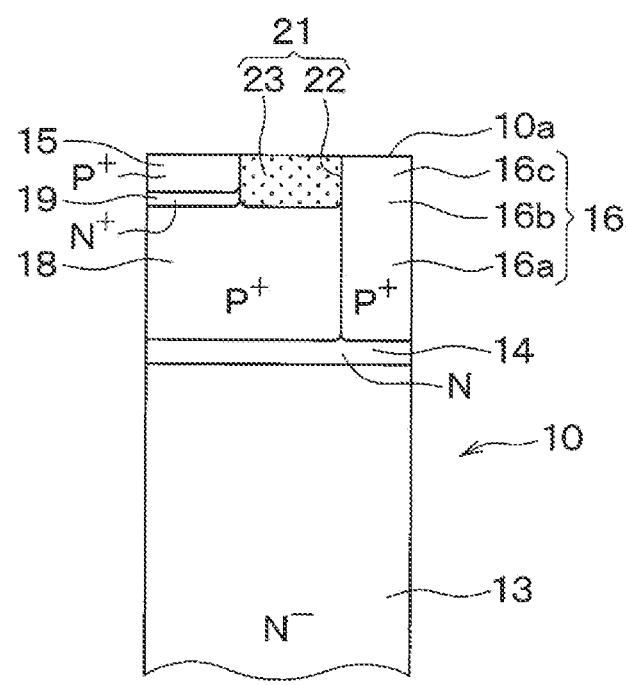
FIG. 6G is a cross-sectional view illustrating a step of the manufacturing process of the semiconductor device subsequent to FIG. 6F.

Next, as shown in FIG. 6G, the STI separation portion 21 is formed in an area which is between the gate layer 15 and the body layer 16 and where the residual region 31, which has been formed when the shield layer 18 is formed, exists. In the present embodiment, the STI separation portion 21 is formed by forming a trench 22 having a predetermined depth, embedding the insulating film 23 in the trench 22 and flattening the embedded insulating film 23 by a chemical mechanical polishing (CMP) technique or the like. As a result, the gate layer 15 and the body layer 16 are separated from each other. The STI separation portion 21 is formed at each of the opposite sides of the gate layer 15 in the longitudinal direction. Therefore, although FIGS. 5G and 6G are cross-sectional views in the same process, the STI separation section 21 is shown only in FIG. 6G.

Thereafter, although not particularly shown, a mask is appropriately formed and an N type impurity such as nitrogen or phosphorus is ion-implanted to form the source layer 17. Then, the interlayer insulating film 24, the gate electrode 25, and the upper electrode 26 are formed on a side adjacent to the one surface 10a of the semiconductor substrate 10, and the lower electrode 27 is formed on a side adjacent to the other surface 10b of the semiconductor substrate 10. As a result, the semiconductor device shown in FIG. 1 is produced.

As described above, in the present embodiment, the semiconductor device is produced by appropriately performing the ion-implantation after the channel layer 14 is formed. Therefore, the semiconductor device formed with the JFET having the shield layer 18 can be manufactured by a simple method. That is, the semiconductor device formed with the JFET, which is capable of reducing the mirror capacitance ratio, can be manufactured by the simple method.

In the present embodiment, the separation layer 19 is formed after the shield layer 18 is formed, and the gate layer 15 is formed after the separation layer 19 is formed. Therefore, it is possible to restrict the shield layer 18 and the gate layer 15 from being electrically connected to each other.

In the present embodiment, the upper portion of the lower body layer 16a and the upper portion of the shield layer 18 are separated from each other by a predetermined distance by forming the expansion region 20 after forming the lower body layer 16a and the shield layer 18. Therefore, the semiconductor device in which an occurrence of the pinch-off is suppressed can be produced.

Second Embodiment

A second embodiment will be described. In the present embodiment, a method for manufacturing a semiconductor device is modified from that of the first embodiment. Descriptions of the same configurations and processes as those of the first embodiment will not be repeated hereinafter.

Figure 7:
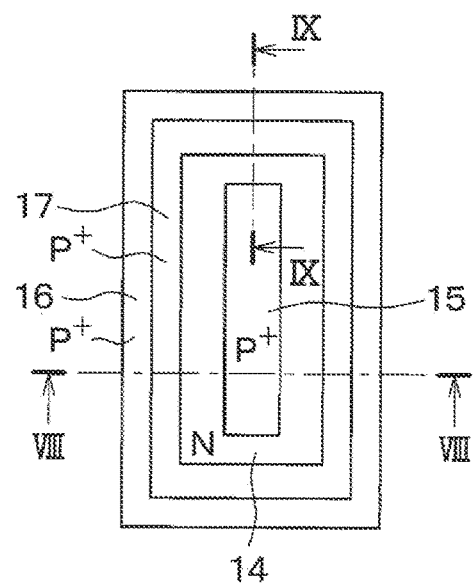
FIG. 7 is a plan view of one cell of a semiconductor device according to a second embodiment.
Figure 8:
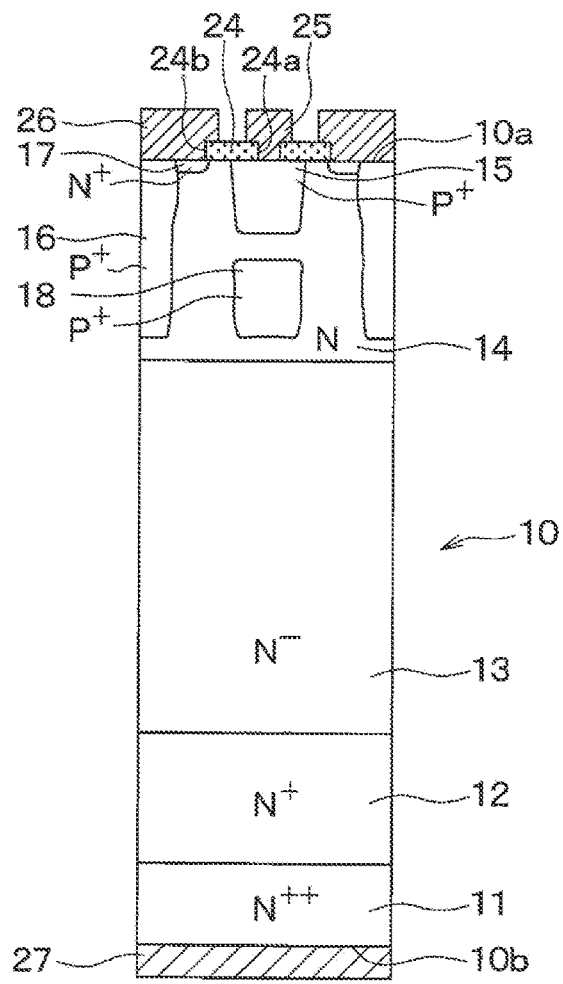
FIG. 8 is a cross-sectional view taken along a line VIII-VIII shown in FIG. 7.
Figure 9:
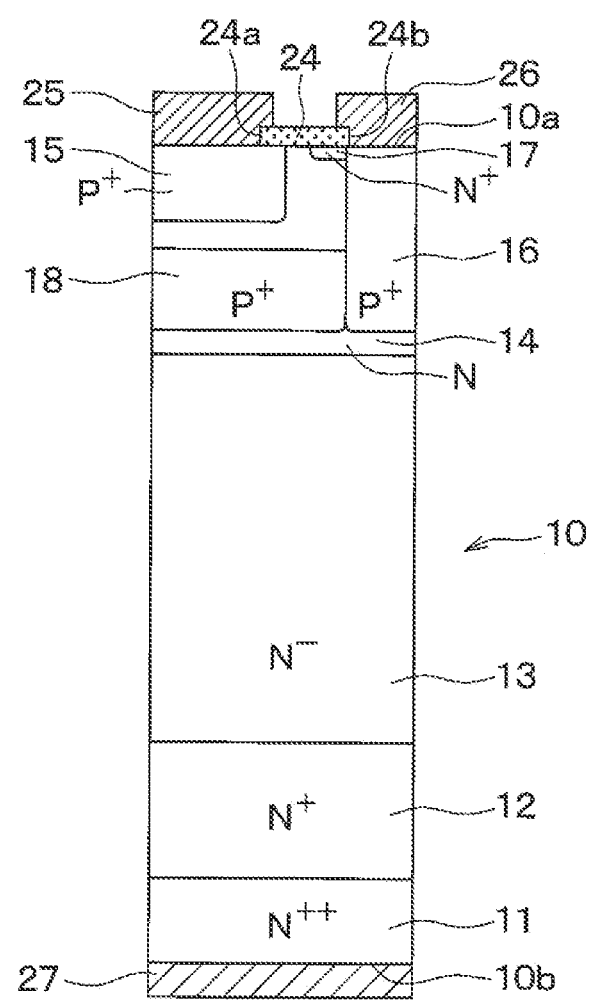
FIG. 9 is a cross-sectional view taken along line IX-IX shown in FIG. 7.

First, the configuration of a semiconductor device of the present embodiment will be described. As shown in FIGS. 7 to 9, the semiconductor device of the present embodiment basically has the same configuration as that of the first embodiment, except that the semiconductor device of the present embodiment does not have the separation layer 19, the expansion region 20, and the STI separation portion 21.

Next, a method for manufacturing the semiconductor device of the present embodiment will be described with reference to FIGS. 10A to 10E and FIGS. 11A to 11E. Note that FIGS. 10A to 10E are cross-sectional views corresponding to FIG. 8. FIGS. 11A to 11E are cross-sectional views corresponding to FIG. 9. Further, Each of FIGS. 10A to 10E and each of FIGS. 11A to 11E show different cross sections in the same step.

Figure 10A:
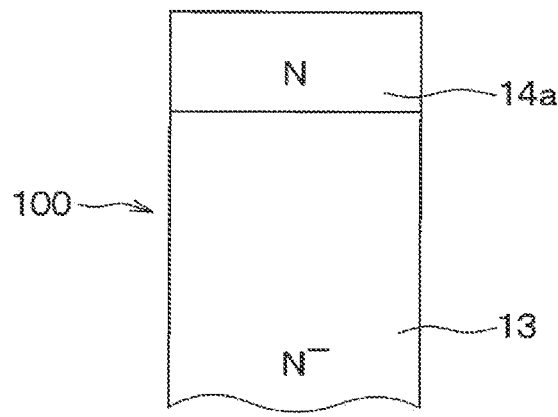
FIG. 10A is a cross-sectional view illustrating a step of a manufacturing process of the semiconductor device shown in FIG. 8.
Figure 11A:
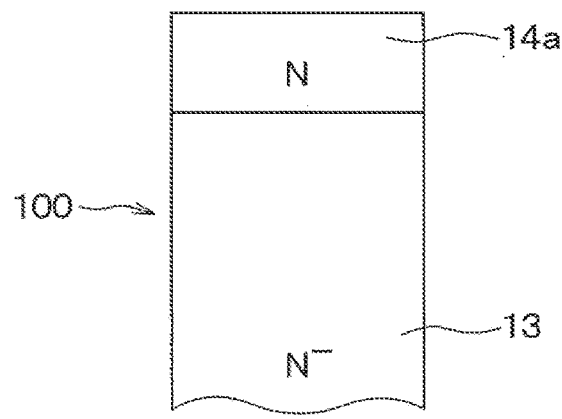
FIG. 11A is a cross-sectional view illustrating a step of the manufacturing process of the semiconductor device shown in FIG. 9.

First, as shown in FIG. 10A and FIG. 11A, after the substrate 100 is prepared, a lower channel layer 14a, which is a part of the channel layer 14 adjacent to the drift layer 13, is formed by growing an epitaxial film of SiC. The thickness of the lower channel layer 14a is set to be equal to or greater than the thickness of the portion where the shield layer 18 is formed.

Figure 10B:
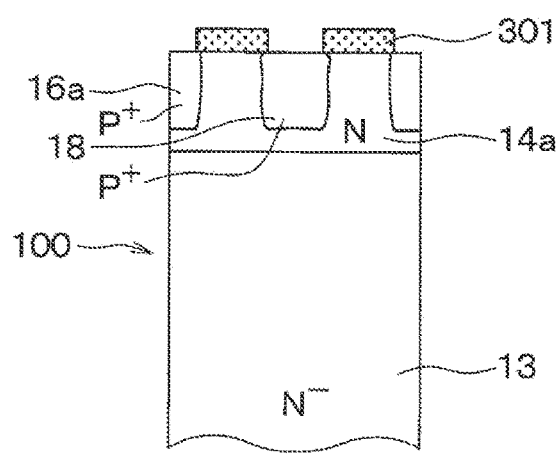
FIG. 10B is a cross-sectional view illustrating a step of the manufacturing process of the semiconductor device subsequent to FIG. 10A.
Figure 10C:
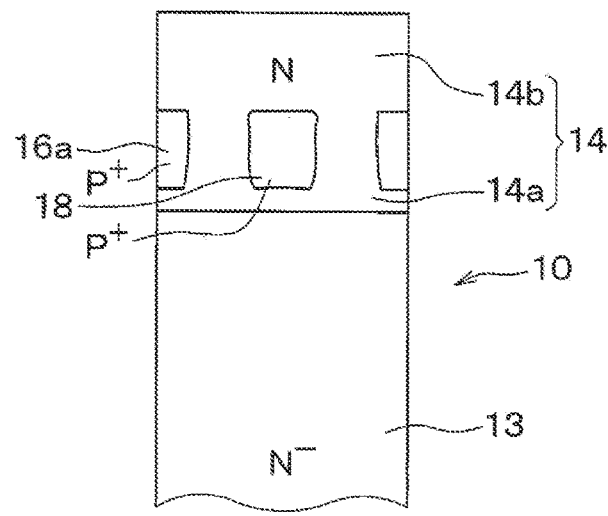
FIG. 10C is a cross-sectional view illustrating a step of the manufacturing process of the semiconductor device subsequent to FIG. 10B.
Figure 11B:
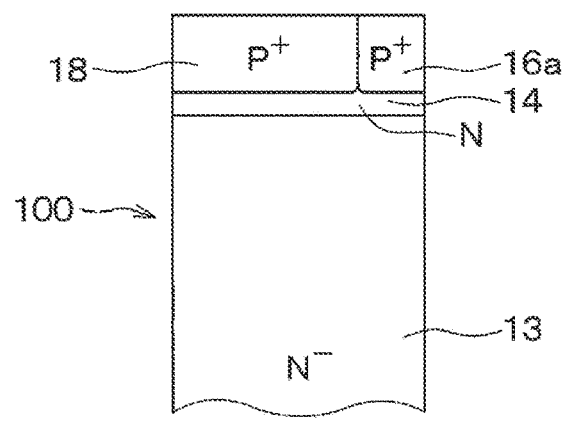
FIG. 11B is a cross-sectional view illustrating a step of the manufacturing process of the semiconductor device subsequent to FIG. 11A.

Next, as shown in FIG. 10B and FIG. 11B, a mask 301 is formed on the lower channel layer 14a to have openings in formation regions where the body layer 16 and the shield layer 18 are to be formed. Then, the lower body layer 16a and the shield layer 18 are formed by ion-implanting a P type impurity such as aluminum. Thereafter, the mask 301 is removed.

In this step, the lower body layer 16a and the shield layer 18 are formed by implanting ions to a top surface of the lower channel layer 14a. In this case, therefore, the acceleration voltage at the time of performing the ion-implantation can be reduced, as compared with the case where the lower body layer 16a and the shield layer 18 are formed by performing the ion implantation after the channel layer 14 is fully formed as in the first embodiment. Therefore, it is possible to restrict impurities from diffusing in the planar direction of the semiconductor substrate 10 when forming the lower body layer 16a and the shield layer 18. In the present embodiment, therefore, the expansions of the upper portions of the lower body layer 16a and the shield layer 18 are made smaller, as compared with those of the lower body layer 16a and the shield layer 18 of the first embodiment described above. For this reason, the step of forming the expansion region 20 is not performed in the present embodiment.

Figure 11C:
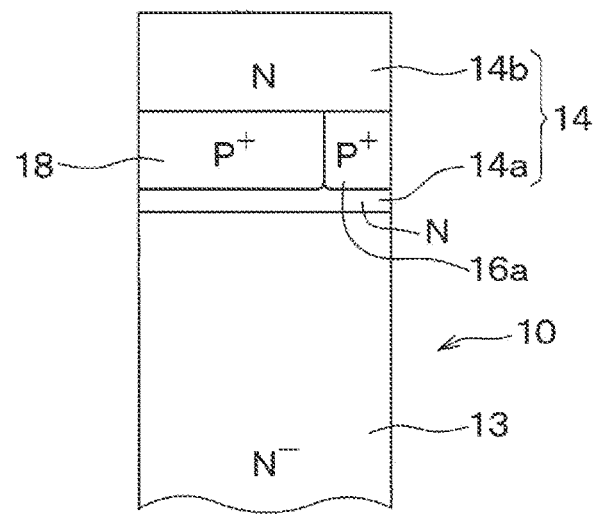
FIG. 11C is a cross-sectional view illustrating a step of the manufacturing process of the semiconductor device subsequent to FIG. 11B.

Next, as shown in FIG. 10O and FIG. 11C, the upper channel layer 14b is formed by again growing an epitaxial film made of SiC on the lower channel layer 14a. As a result, the channel layer 14 is formed, and thus the semiconductor substrate 10 is formed. In the present embodiment, the lower channel layer 14a and the upper channel layer 14b correspond to the channel constituent layers. That is, the channel layer 14 is made of the lower channel layer 14a and the upper channel layer 14b.

Figure 10D:
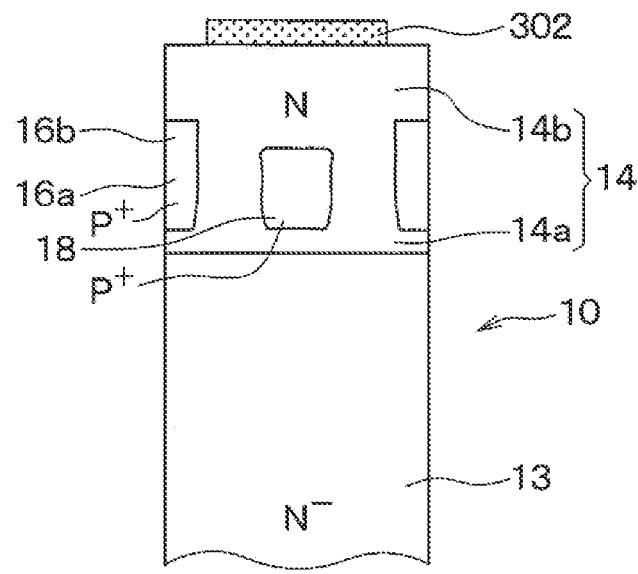
FIG. 10D is a cross-sectional view showing a step of the manufacturing process of the semiconductor device subsequent to FIG. 10C.
Figure 11D:
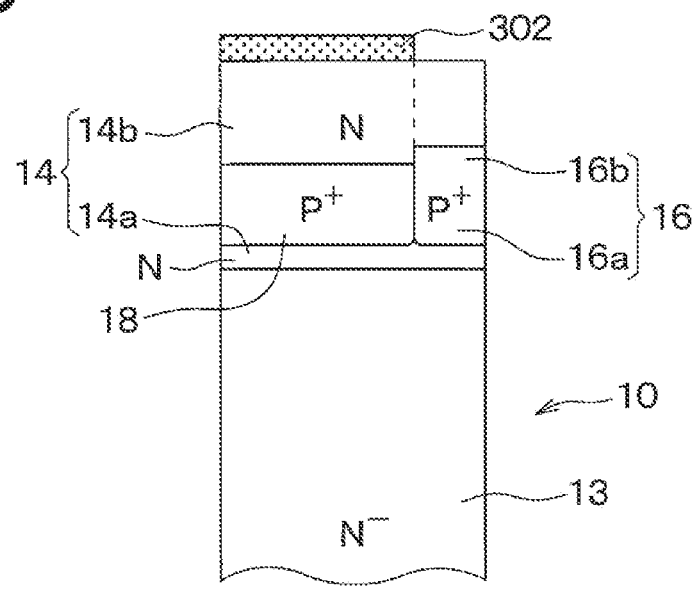
FIG. 11D is a cross-sectional view showing a step of the manufacturing process of the semiconductor device subsequent to FIG. 11C.

Next, as shown in FIG. 10D and FIG. 11D, a mask 302 is formed to have an opening in a formation region where the body layer 16 is to be formed. Then, the intermediate body layer 16b is formed by ion-implanting a P type impurity such as aluminum. Thereafter, the mask 302 is removed. Although the residual region 32 is formed also in the present embodiment, the residual region 32 is not particularly shown because the residual region 32 is replaced with the upper body layer 16c described later.

Figure 10E:
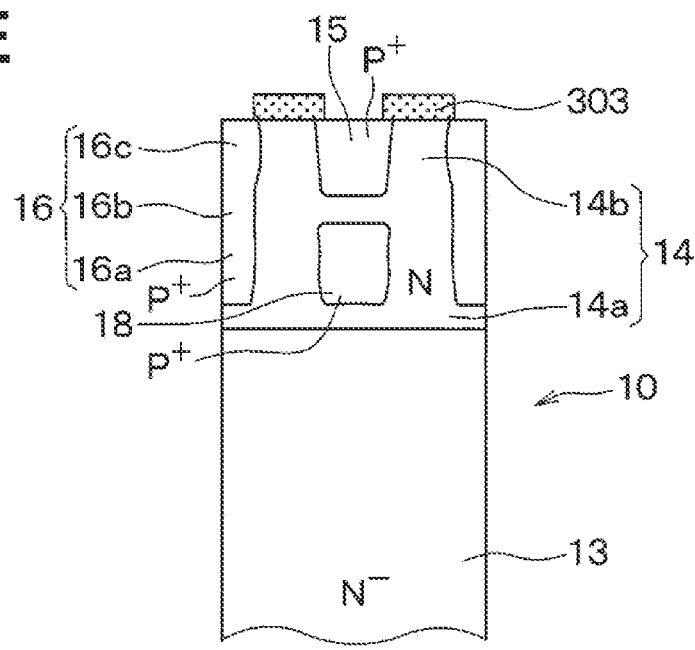
FIG. 10E is a cross-sectional view illustrating a step of the manufacturing process of the semiconductor device subsequent to FIG. 10D.
Figure 11E:
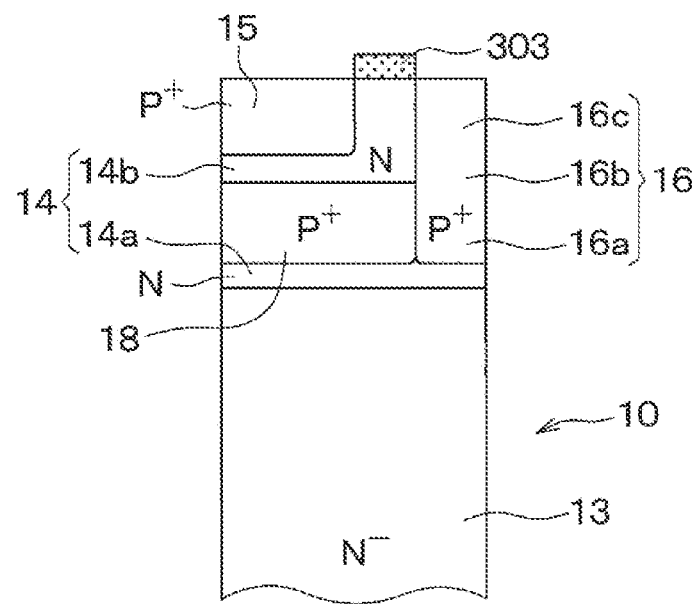
FIG. 11E is a cross-sectional view illustrating a step of the manufacturing process of the semiconductor device subsequent to FIG. 11D.

Then, as shown in FIG. 10E and FIG. 11E, a mask 303 is formed to have an opening in a formation region where the gate layer 15 and the body layer 16 are to be formed. Then, the upper body layer 16c is formed by ion-implanting a P type impurity such as aluminum, to thereby form the body layer 16 and the gate layer 15.

In the present embodiment, since the channel layer 14 is formed separately in two steps, the residual region 31 is not formed above the shield layer 18 when the shield layer 18 is formed. Therefore, the gate layer 15 and the shield layer 18 are separated from each other even if the separation layer 19 is not formed. Further, in the present embodiment, the gate layer 15 and the body layer 16 are separated from each other even if the STI separation portion 21 is not formed.

Thereafter, although not particularly shown, the source layer 17, the gate electrode 25, the upper electrode 26, and the lower electrode 27 are appropriately formed. As a result, the semiconductor device of the present embodiment is obtained.

As described above, even if the channel layer 14 is formed by performing the epitaxial growth twice, the semiconductor device formed with the JFET having the shield layer 18 can be easily manufactured.

In the present embodiment, the lower body layer 16a and the shield layer 18 are formed after the lower channel layer 14a is formed, and then the upper channel layer 14b is formed. Therefore, the shield layer 18 and the gate layer 15 can be separated from each other without forming the separation layer 19. As such, the step of forming the separation layer 19 can be omitted.

Further, in the present embodiment, the lower body layer 16a and the shield layer 18 are formed after the lower channel layer 14a is formed. Therefore, the acceleration voltage when forming the lower body layer 16a and the shield layer 18 can be lowered, and the impurities can be suppressed from spreading in the planar direction of the semiconductor substrate 10. Therefore, the step of forming the expansion region 20 can be omitted.

Third Embodiment

A third embodiment will be described. In the present embodiment, a method for manufacturing a semiconductor device is modified from that of the second embodiment.

Descriptions of the same configurations and processes as those of the second embodiment will not be repeated hereinafter.

Figure 12A:
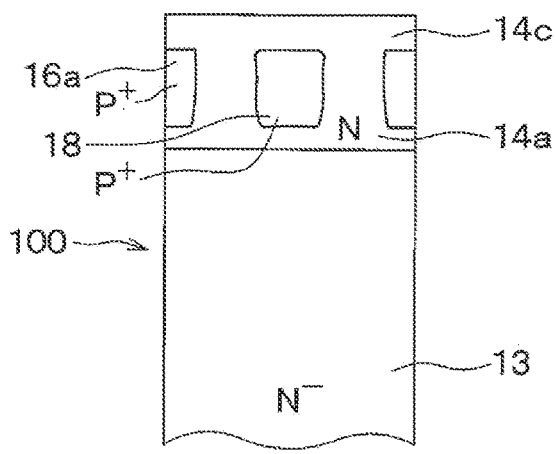
FIG. 12A is a cross-sectional view illustrating a step of a manufacturing process of a semiconductor device according to a third embodiment.
Figure 12B:
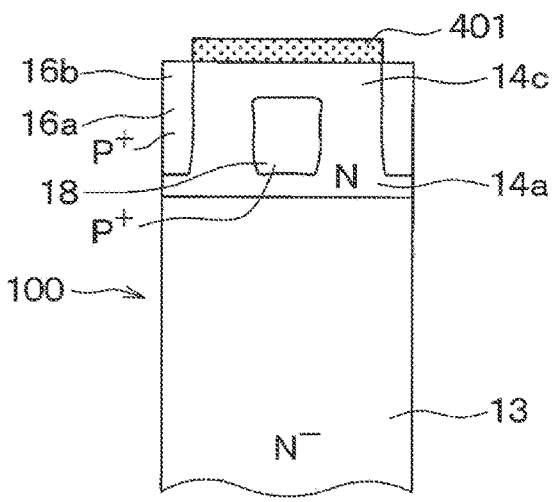
FIG. 12B is a cross-sectional view illustrating a step of the manufacturing process of the semiconductor device subsequent to FIG. 12A.
Figure 12C:
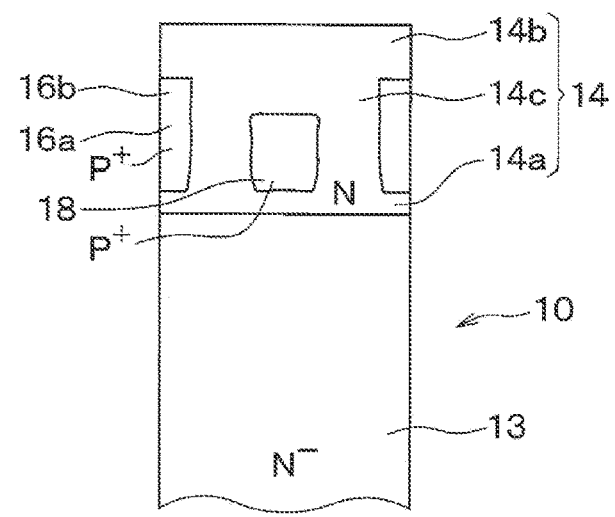
FIG. 12C is a cross-sectional view illustrating a step of the manufacturing process of the semiconductor device subsequent to FIG. 12B.
Figure 13A:
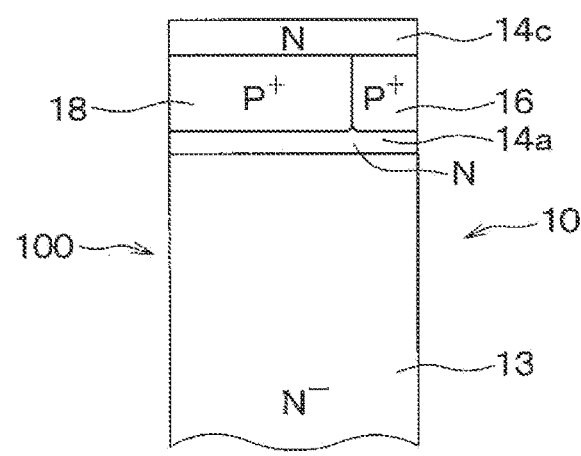
FIG. 13A is a cross-sectional view showing a step of a manufacturing process of a semiconductor device according to a third embodiment.
Figure 13B:
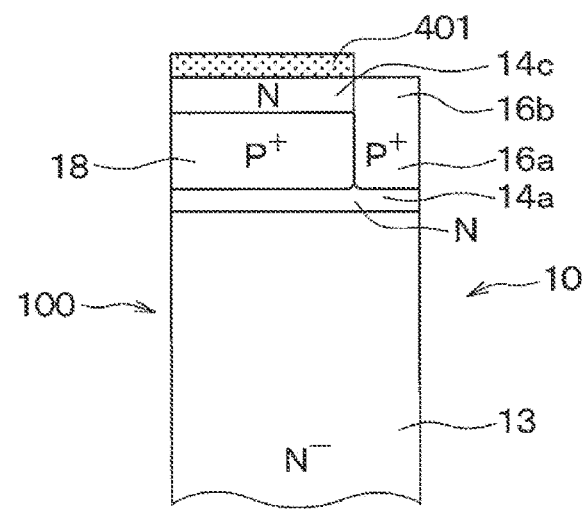
FIG. 13B is a cross-sectional view illustrating a step of the manufacturing process of the semiconductor device subsequent to FIG. 13A.
Figure 13C:
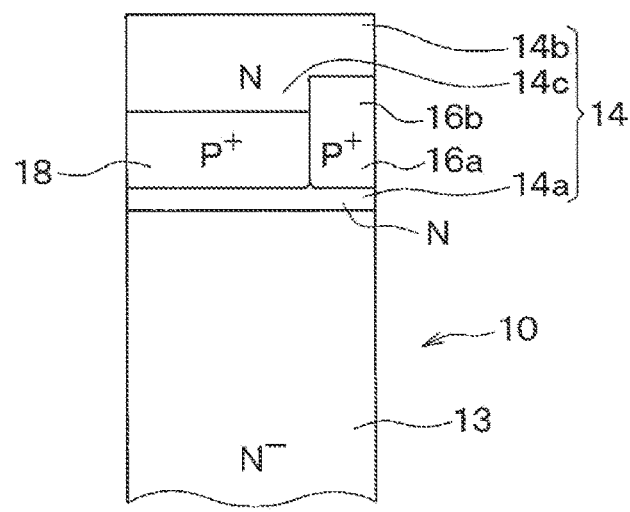
FIG. 13C is a cross-sectional view illustrating a step of the manufacturing process of the semiconductor device subsequent to FIG. 13B.

Hereinafter, in regard to the method for manufacturing the semiconductor device of the present embodiment, the differences from the second embodiment will be described with reference to FIGS. 12A to 12C and FIGS. 13A to 13C. Note that FIGS. 12A to 12C are cross-sectional views corresponding to FIG. 8. FIGS. 13A to 13C are cross-sectional views corresponding to FIG. 9. Each of FIGS. 12A to 12C and Each of FIGS. 13A to 13C show different cross sections in the same step.

In the present embodiment, as shown in FIG. 12A and FIG. 13A, an intermediate channel layer 14c is formed by growing an epitaxial film of SiC on the lower channel layer 14a after performing the step show in FIG. 10B and FIG. 11B. The intermediate channel layer 14c has a thickness corresponding to the distance between the gate layer 15 and the shield layer 18. In the present embodiment, the intermediate channel layer 14c corresponds to the channel constituent layer. That is, the channel layer 14 of the present embodiment is made of the lower channel layer 14a, the intermediate channel layer 14c and the upper channel layer 14b.

Next, as shown in FIG. 12B and FIG. 13B, a mask 401 is formed to have an opening in a formation region where the body layer 16 is to be formed. Next, the intermediate body layer 16b is formed by ion-implanting a P type impurity such as aluminum, and then the mask 401 is removed.

Thereafter, as shown in FIG. 12C and FIG. 13C, the upper channel layer 14b is formed by growing an epitaxial film of SiC on the intermediate channel layer 14c. As a result, the channel layer 14 is formed. In this way, semiconductor substrate 10 is produced.

When the steps shown in FIG. 10D and FIG. 11D and subsequent steps are performed, the semiconductor device of the second embodiment is obtained.

As described above, even if the channel layer 14 is formed by performing the epitaxial growth three times, the similar effects to those of the second embodiment can be obtained.

OTHER EMBODIMENTS

Although the present disclosure has been described in accordance with the embodiments, it is understood that the present disclosure is not limited to such embodiments or structures thereof. The present disclosure encompasses various modifications and variations within the scope of equivalents. In addition, various combinations and forms, and further, other combinations and forms including only one element, or more or less than these elements are also within the scope and the scope of the present disclosure.

In each of the embodiments descried above, the configurations have been described in which the N type is the first conductivity type and the P type is the second conductivity type. Alternatively, the first conductivity type may be P type and the second conductivity type may be N type.

In each of the embodiments described above, the SiC semiconductor device has been described as an example. Alternatively, the present disclosure can be adapted to another compound semiconductor device or a semiconductor device formed by hetero-epitaxy growth on a silicon substrate.

In the second and third embodiments described above, the channel layer 14 may be configured by further performing a plurality of epitaxial growths. That is, the channel layer 14 may be configured by stacking a further number of channel constituent layers.

In each of the embodiments described above, the shield layer 18 may be connected to the body layer 16 in a direction intersecting the longitudinal direction, for example. Alternatively, the shield layer 18 may not be connected to the body layer 16 as long as the shield layer 18 is maintained at a potential different from that of the gate layer 15.

What is claimed is:

1. A method for manufacturing a semiconductor device having a junction field effect transistor, the method comprising:
preparing a substrate having a first conductivity type drain layer and a first conductivity type drift layer above the first conductivity type drain layer;
forming a first conductivity type channel layer having an impurity concentration higher than that of the first conductivity type drift layer above the first conductivity type drift layer by an epitaxial growth, to thereby produce a semiconductor substrate;
forming a second conductivity type gate layer within the first conductivity type channel layer by performing an ion-implantation, the second conductivity type gate layer extending from a surface of the semiconductor substrate adjacent to the first conductivity type channel layer in a depth direction corresponding to a thickness direction of the semiconductor substrate;
forming a second conductivity type body layer at a position separated from the second conductivity type gate layer within the first conductivity type channel layer by performing an ion-implantation, the second conductivity type body layer extending from the surface of the semiconductor substrate in the depth direction; and
forming a second conductivity type shield layer located between the second conductivity type gate layer and the first conductivity type drift layer within the first conductivity type channel layer by performing an ion-implantation, the second conductivity type shield layer being formed to face the second conductivity type gate layer while being separated from the second conductivity type gate layer.

2. The method according to claim 1, wherein
in the forming of the second conductivity type shield layer, the ion-implantation is performed to the surface of the semiconductor substrate to form the second conductivity type shield layer, after the semiconductor substrate is produced,
the method further comprising:
after the forming of the second conductivity type shield layer, forming a first conductivity type separation layer having an impurity concentration higher than that of the first conductivity type channel layer between the second conductivity type shield layer and the second conductivity type gate layer within the first conductivity type channel layer, by performing an ion-implantation, wherein
the forming of the second conductivity type gate layer is performed after the forming of the first conductivity type separation layer.

3. The method according to claim 1, wherein
the forming of the second conductivity type body layer includes forming a lower body layer at a same depth as the second conductivity type shield layer, as a part of the second conductivity type body layer,
the method further comprising:

after the forming of the second conductivity type shield layer and the forming of the lower body layer, forming a first conductivity type expansion region having an impurity concentration higher than that of the first conductivity type channel layer by performing an ion-implantation, at a position between a portion of the second conductivity type shield layer adjacent to the surface of the semiconductor substrate and a portion of the lower body layer adjacent to the surface of the semiconductor substrate.

4. The method according to claim 1, wherein the forming of the first conductivity type channel layer includes performing a plurality number of the epitaxial growths to form a plurality of channel constituent layers in the semiconductor substrate, and the forming of the second conductivity type body layer includes performing the ion-implantation to the plurality of channel constituent layers to form the second conductivity type body layer.

5. The method according to claim 4, wherein the forming of the first conductivity type channel layer includes forming a lower channel layer, as one of the plurality of channel constituent layers, adjoining to the drift layer, and forming an upper channel layer, as another one of the plurality of channel constituent layers, above the lower channel layer, in the forming of the second conductivity type shield layer, the ion-implantation is performed to the lower channel layer to form the second conductivity type shield layer in the lower channel layer, and in the forming of the second conductivity type gate layer, the ion-implantation is performed to the upper channel layer to form the second conductivity type gate layer in the upper channel layer separated from the second conductivity type shield layer.

* * * * *